United States Patent
Saleh

(10) Patent No.: US 9,091,942 B2
(45) Date of Patent: Jul. 28, 2015

(54) SCATTEROMETRY MEASUREMENT OF LINE EDGE ROUGHNESS IN THE BRIGHT FIELD

(75) Inventor: Nedal R. Saleh, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 922 days.

(21) Appl. No.: 13/300,120

(22) Filed: Nov. 18, 2011

(65) Prior Publication Data

US 2013/0132036 A1    May 23, 2013

(51) Int. Cl.
*G06F 17/50* (2006.01)
*G03F 7/20* (2006.01)

(52) U.S. Cl.
CPC .................. *G03F 7/70625* (2013.01)

(58) Field of Classification Search
CPC .............................. G03F 7/705; G03F 7/70625
USPC ............... 716/54–55, 110–111, 136
See application file for complete search history.

(56) References Cited

U.S. PATENT DOCUMENTS

| | | | |
|---|---|---|---|
| 6,697,153 B1 | 2/2004 | Wright et al. | |
| 7,184,152 B2 | 2/2007 | Brill | |
| 7,233,390 B2 | 6/2007 | Chang et al. | |
| 7,268,876 B1 | 9/2007 | Johs | |
| 7,463,369 B2 | 12/2008 | Wack et al. | |
| 7,733,502 B2 | 6/2010 | Moriya et al. | |
| 2003/0147086 A1 | 8/2003 | Rosencwaig et al. | |
| 2005/0195413 A1 | 9/2005 | Brill | |
| 2010/0157315 A1* | 6/2010 | Bischoff | 356/612 |
| 2010/0315627 A1 | 12/2010 | Wu et al. | |
| 2011/0037988 A1 | 2/2011 | Brill | |
| 2013/0066597 A1* | 3/2013 | Van Beurden | 703/1 |
| 2013/0144560 A1* | 6/2013 | Pisarenco et al. | 702/189 |

OTHER PUBLICATIONS

Schuster, T. et al.; Influence of Line Edge Roughness (LER) on Angular Resolved and on Spectroscopic Scatterometry; SimTech, Institute of Applied Optics, University of Stuttgart; No. 2008-20; Stuttgart, Germany.

* cited by examiner

*Primary Examiner* — Paul Dinh
(74) *Attorney, Agent, or Firm* — Howard M. Cohn; Joseph P. Abate; H. Daniel Schnurmann

(57) ABSTRACT

A system and method for assessing line edge roughness (LER) is disclosed. An artificial conformal liner on a simulation test structure absorbs the same amount of light that otherwise would be scattered in the dark-field by a rough surface. A RCWA based scatterometry model is used to model absorption and the absorption is correlated to line edge roughness, which allows RCWA to be used in effect to model LER.

17 Claims, 4 Drawing Sheets

SCATTEROMETRY MEASUREMENT OF LINE EDGE ROUGHNESS IN THE BRIGHT FIELD

FIELD OF THE INVENTION

The present invention relates generally to semiconductor fabrication, and more particularly to measurement of line edge roughness.

BACKGROUND OF THE INVENTION

The integrated circuit industry is driven by Moore's law for scaling to maintain continuous improvement in technological performance and economical sustainability. This defines an integration and densification roadmap in terms of the smallest printable feature or device size. Currently, the densification of integrated circuits is reaching its limits for planar scaling at 22 nm technology node, which leads designers to consider 3-D integration schemes. A manufacturing process based on 3-D integration requires effective metrology or quality control of the fabricated patterns. Scatterometry or Optical Critical Dimension (OCD) is being increasingly adopted as the metrology of choice for 3-D integration due to its non-destructive and penetrative nature along with its high throughput meeting the metrology requirements for 3-D integration based micro-fabrication processes. This is in contrast to the conventionally and widely-adopted metrology based on Scanning Electron Microscopes (CDSEM) which offers only 2-D or top-down imaging and considered in many cases destructive to measured samples.

Among the most important fabrication parameters to control that is detrimental to device performance is the transistor gate line width, the variability of which is subject to tight dimensional specifications set commonly by the International Technology Roadmap for Semiconductor manufacturing (ITRS). Commonly referred to as Line Edge Roughness (LER) or Line Width Roughness (LWR), depending on the spatial frequency of the variability, the term was developed traditionally from the top-down imaging legacy from the CDSEM technology over the past various micro-fabrication technology nodes. However, this variability in general is associated with the surface of the pattern and is largely isotropic. As such, LER and LWR can be generalized to Surface Roughness (SR), given a metrology that is vertical-horizontal bias free, and in this case OCD is.

SR in general can be controlled and reduced for better device performance, but needs to be accurately measured to provide control tools for micro-fabrication process engineers. A key aspect of LER and LWR is that they exhibit random variability. Scatterometry, while ideal for 3-D pattern metrology, is fundamentally incapable of measuring pattern roughness primarily because of their randomness. The reason for this serious shortcoming in measuring random features is that in development and manufacturing environments, only high throughput algorithms can be used for scatterometry modeling.

The most adopted algorithm which meets this requirement is called Rigorous Coupled Wave Analysis (RCWA) which relies on drawing the physical shape of the nano-device pattern in a unit cell then replicating this cell to simulate the entire scatterometry target, or sample. The shape of the device to be dimensionally measured by scatterometry is drawn in the cell very accurately and the optical properties of the various materials constituting the device shape are also included, this often involved effort is usually referred to as OCD modeling or scatterometry model development. Scatterometry utilizes arrayed targets to maximize the diffraction signal resulting from a focused light beam impinging on these targets located usually in the wafer scribe lines or kerfs between chips. As such, any feature drawn in the fundamental cell is exactly copied over the entire simulated target, and since random features are sample-wide there is no way to generate this extended randomness over the entire sample from the fundamental cell alone. To exacerbate this conundrum, it is important to note two points; first, LER in the advanced technology nodes at 14 nm and below may potentially consume up to 40% of the line width Critical Dimension (CD), as LER does not scale down with line width and the ratio of LER/CD continues to increase with shrinking technology nodes. Second, LER cannot be ignored in the scatterometry model since this will lead to significant inaccuracy in the model and fail to deliver the needed metrology value. In order for scatterometry to continue to be adopted as the metrology of choice for 3-D integration, a solution to LER modeling and measurement is required.

SUMMARY

In one embodiment, the present invention provides a method of measuring line edge roughness. The method comprises, performing a plurality of rigorous-couples-wave-analysis simulations of absorption with multiple diffraction patterns, analyzing a physical semiconductor structure for line edge roughness with a scatterometry tool, identifying one of the plurality of rigorous-couples-wave-analysis simulations as a best-fit model, using the best-fit model to derive an optimal extinction parameter value for a semiconductor structure, and associating the modeled absorption to line edge roughness.

In another embodiment, a system for measuring line edge roughness is provided. The system comprises a computer comprising a processor and memory, a database configured and disposed to be accessible by the processor, a scatterometry tool configured and disposed to communicate with the computer. The memory contains machine instructions, that when executed by the processor, perform the steps of performing a plurality of rigorous-couples-wave-analysis simulations of absorption with multiple diffraction patterns, thereby generating modeled diffraction spectra, storing the modeled diffraction spectra in the database, analyzing a physical semiconductor structure for line edge roughness with the scatterometry tool, identifying one of the plurality of rigorous-couples-wave-analysis simulations as a best-fit model, using the best-fit model to derive an optimal extinction parameter value for a semiconductor structure, and associating the modeled absorption to line edge roughness.

In another embodiment, a system for measuring line edge roughness is provided. The system comprises a computer comprising a processor and memory, a database configured and disposed to be accessible by the processor, a scatterometry tool configured and disposed to communicate with the computer. The memory contains machine instructions, that when executed by the processor, perform the steps of performing a rigorous-couples-wave-analysis simulation of absorption on a semiconductor simulation test structure, wherein the semiconductor simulation test structure comprises data stored in the memory, and wherein the semiconductor simulation test structure comprises a representation of a substrate with an absorptive liner disposed on the substrate, storing the modeled diffraction spectra in the database, analyzing a physical semiconductor structure for line edge roughness with the scatterometry tool, identifying one of the plurality of rigorous-couples-wave-analysis simulations as a best-fit model, using the best-fit model to derive an optimal extinction parameter value for a semiconductor structure, and associating the modeled absorption to line edge roughness.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGs) of the drawing, in which case typically the last two significant digits may be the same, the most significant digit being the number of the drawing figure (FIG).

FIG. 1 shows an ideal semiconductor test structure.

FIG. 2 shows a semiconductor test structure having line edge roughness.

FIG. 3 shows a semiconductor test structure with an absorptive artificial liner.

FIG. 4 is a detailed view of the vertical cut-out of a semiconductor test structure.

FIG. 5 is a flowchart indicating process steps for an embodiment of the present invention.

FIG. 6 is a block diagram of a system in accordance with an embodiment of the present invention.

DETAILED DESCRIPTION

RCWA is a commonly used optical diffraction simulation technique for scatterometry analysis in high throughput micro-fabrication factories. However, it has not previously been successfully used for LER modeling because LER is a sample-wide random phenomenon, and RCWA is cell-based, the sample is made of replicated cells and any randomness induced in the cell will repeat, and hence, there is no sample wide randomness.

Embodiments of the present invention provide a method that enables RCWA to be effectively used to model LER. This is significant because RCWA and the associated scatterometry tools (equipment) are currently used in the semiconductor micro-fabrication environments as metrology or quality control.

Figure 1:
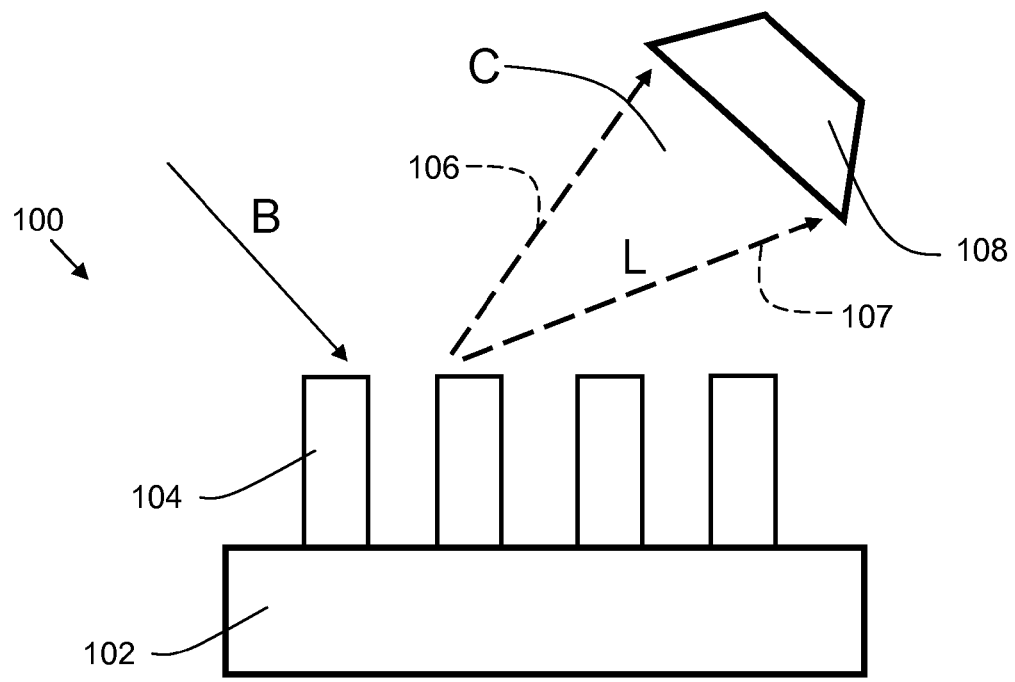

FIG. 1 shows an ideal case of a semiconductor simulation test structure 100 without any line edge roughness. Semiconductor test structure 100 is comprised of a base 102, and a plurality of vertical structures 104. In this case, light from an incident spectroscopic beam B is diffracted as light L from the structure 100, and is coherently collected within the detector acceptance cone C (bright field) which is an area bounded by light beams 106 and 107. This case can be modeled with scatterometry. The light L within the detector acceptance cone C is detected by a light detector 108.

Figure 2:
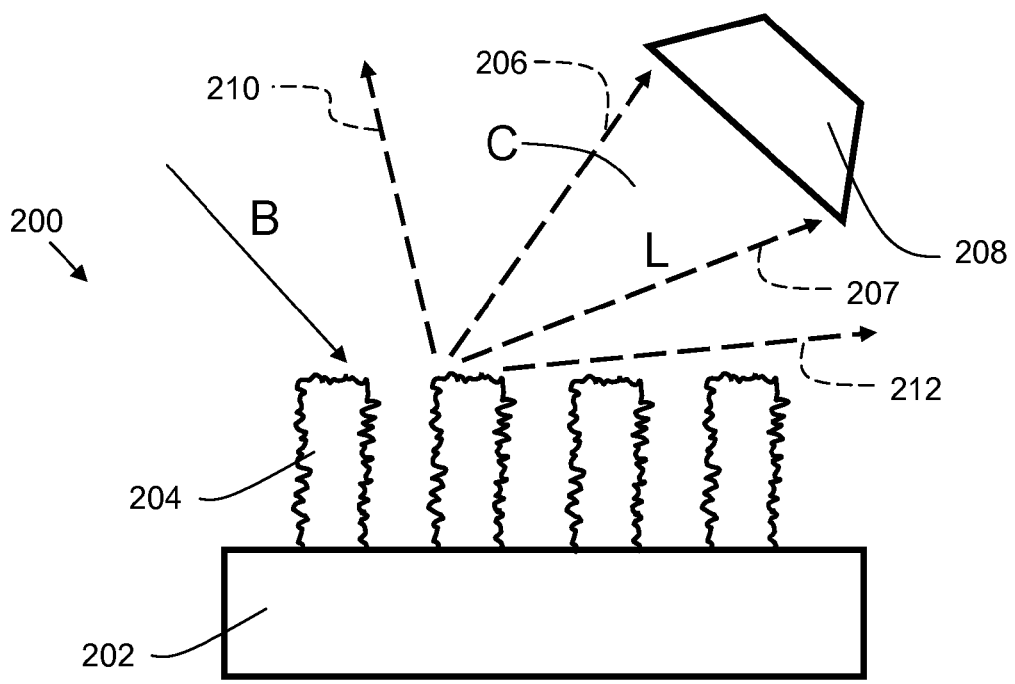

FIG. 2 shows a semiconductor simulation test structure 200 having line edge roughness. Semiconductor test structure 200 is comprised of a base 202, and a plurality of vertical structures 204. As stated previously, often, similar elements may be referred to by similar numbers in various figures (FIGs) of the drawings, in which case typically the last two significant digits may be the same. For example, detector 208 of FIG. 2 is similar to detector 108 of FIG. 1. Unlike vertical structures 104 of FIG. 1, vertical structures 204 have line edge roughness (LER). This causes some light from incident beam B to be reflected and diffused outside of the detector acceptance cone C. This is represented by light beams 210 and 212, which fall outside of detector acceptance cone C, and hence are not detected by light detector 208. Hence, when a spectroscopic light source is impinged on a sample having LER, a portion of the light L is reflected into the detector 208 collecting the diffracted light along the natural reflection direction (bright field), and a portion of the light (represented by light beams 210 and 212) is scattered elsewhere outside the bright field. The area outside the bright field is referred to as the "dark field" and light in the dark field does not reach the detector 208.

Figure 3:
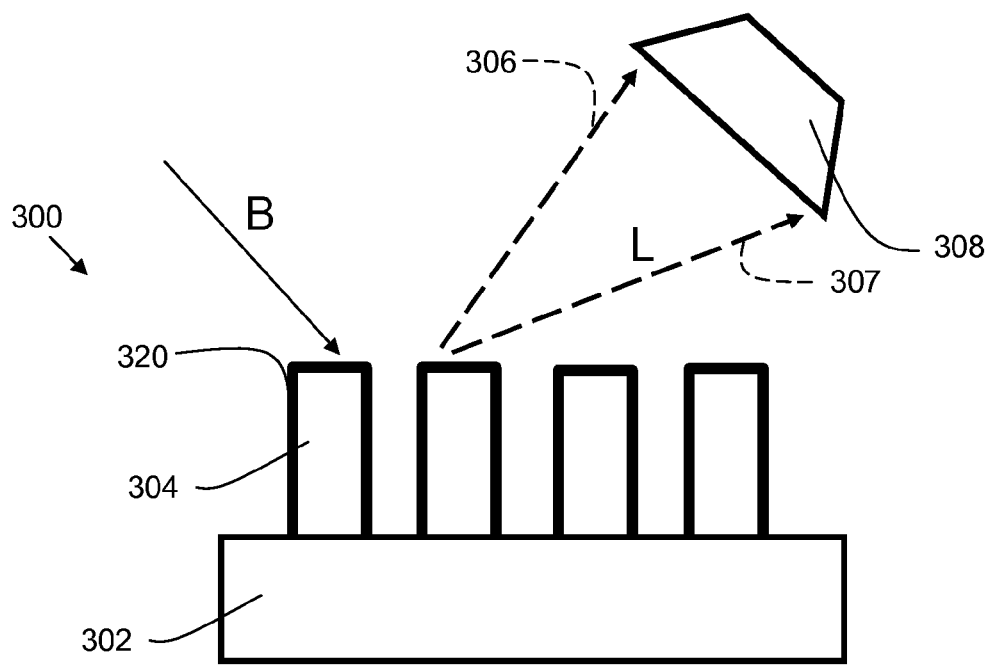

FIG. 3 shows a semiconductor simulation test structure 300 having an artificial absorptive liner which simulates the diffusive properties of line edge roughness. A calibrated artificial absorptive liner 320 is drawn on vertical structures 304. This artificial liner in the scatterometry model is either made of the same structure material or an equal mixture of the structure material and vacuum (or ambient gas) using what is commonly known in scatterometry as the Effective Medium Approximation (EMA). Hence, the density ratio (ratio of liner material to ambient gas or vacuum) may in some embodiments be 50 percent (half material, and half ambient gas or vacuum), and in other embodiments be 100 percent (all material). The artificial absorptive liner 320 has the same effect on the scattered light outside the detector acceptance cone C as LER—and thus can be modeled with scatterometry.

Light from incident beam B is absorbed by the artificial liner 320, and hence less diffracted light L enters detector 308. Embodiments of the present invention exploit this phenomenon by correlating light absorption in the semiconductor test structure 300 to scattering in the dark field due to line edge roughness. Since both absorption and LER result in a portion of light not reaching the detector in the bright field, a correlation between LER and absorption can be derived and utilized. The semiconductor simulation test structure is designed to resemble (in a geometrical sense) a physical semiconductor structure. RCWA modeling can be then used to model and predict absorption, and that absorption can then be associated with a level of LER present on a sample. Hence, embodiments of the present invention provide an accurate vehicle to describe the physical process taking place in the measured sample (physical semiconductor structure).

In order to model the absorption, the artificial conformal absorptive liner 320 is drawn over portions of semiconductor test structure 300. Semiconductor simulation test structure 300 comprises multiple "primary cells", which means it is used as a repeating unit in the RCWA model. The primary cell is the smallest repeating structure that can form the sample, as such FIG. 3 may be considered as a sample of four primary cells (304, 313, 315, and 317). The thickness of the artificial liner 320 affects the behavior of light of various amplitudes. The desired thickness of the liner depends on the quality of the fabrication and patterning process producing roughness. In one embodiment, the thickness of the artificial liner 320 ranges from about 1 nanometer to about 10 nanometers. Hence, by selecting the appropriate liner thickness, while keeping the refractive index n of the liner the same as that of the sample material that comprises the semiconductor test structure 300, the absorption of a particular wavelength can be deduced. In another embodiment, is also possible to approximate the material constituting the liner as an equal mix of air and sample material using EMA. The aforementioned process can be iterated to optimize the artificial liner thickness.

Hence, to associate LER with absorption, the extinction parameter kappa (K) of the material is optimized in the scatterometry model. Deriving an optimal extinction parameter value can be achieved by breaking down the total absorption in the artificial liner into two components; one is the natural absorption in the ideal material $\kappa_{real}$, and the LER component due to the line edge roughness present on the sample $\kappa_{LER}$. Thus, $\kappa_{total}(\lambda)=\kappa_{real}(\lambda)+\kappa_{LER}(\lambda)$. Notice that $\kappa(\lambda)$ means that the extinction parameter is wavelength dependant.

The $\kappa_{total}$ can be known from matching the scatterometry model to the signal collected by the equipment detector. $\kappa_{real}(\lambda)$ is also known, based on tabulated material properties, and hence, the $\kappa_{LER}(\lambda)$ can be derived.

The $\kappa_{LER}(\lambda)$ represents the amount of light that would "appear to be absorbed" due to the effects of line edge roughness. The RCWA algorithm optimizes $\kappa_{LER}(\lambda)$ in the scatterometry model similar to other parameters or Degrees of Freedom (DOF). The resulting $\kappa_{LER}(\lambda)$ minimizes the residual $\chi^2$ between the detector-measured spectroscopic signal diffracted from the sample $\psi_{det}(\lambda)$ and that which is simulated or modeled in the scatterometry model $\psi_{mod}$, both normalized to a precision function $\sigma(\lambda)$. This residual is the outcome from the chi-square global minimization method $$\chi^2 = \sum_i \left[\frac{\Psi_{mod}(\lambda_i) - \Psi_{det}(\lambda_i)}{\sigma(\lambda_i)}\right]^2$$

$\kappa_{LER}(\lambda)$ is optimized wavelength by wavelength and as such carries information on the surface roughness scattering dependency on the impinging wavelength. Rayleigh scattering (RS) analysis is well-suited for analyzing LER because it describes the behavior of light when the scatterer grain size of the object is much smaller than the wavelength of the impinging light. In this case, the light wavelength is typically in the 200-900 nm range, and the grain size of the LER is in the range of 1-10 nm, so it is eligible to be analyzed with RS. This gives $$\kappa_{LER}(\lambda) = \log\left(\int\int_S f(\lambda, r)\rho(r)C(\lambda)dr\right)$$

where $$f(\lambda, r) \equiv \frac{I}{I_0} = \frac{\pi^4 r^5}{\lambda^4 R^2}\left(\frac{n^2(\lambda)-1}{n^2(\lambda)+1}\right)(\alpha_s + \alpha_p \cos^2\theta)$$

$$\alpha_s + \alpha_p = 1$$

$f(\lambda,r)$ is a RS function for a given wavelength and particle (grain) size, $\rho(r)$ is the normalized Power Spectrum Density (PSD) function for a given particle size, and $C(\lambda)$ is a dimensionless calibration parameter. The integral above is carried over the space of grain size, r, and entire pattern surface S. Here $n(\lambda)$ is the material refractive index, R is the detector-sample distance and $\alpha_i$ is the polarizability of the sample. The light scatters in the $\theta$ directions according to RS.

The above equation can be solved to derive $\rho(r)$. Hence, LER can be reported from the scatterometry model by amplitude and PSD. The former can be derived from the calibrated artificial absorptive liner thickness and the latter from the function $\rho(r)$.

The disclosed embodiments are very beneficial because they accurately describe the physical process taking place on the sample and are very sensitive, i.e., about 2000 times more than the process of tediously collecting the scattered signal from the dark field. This is because of the factor of $2\pi N$, as the bright field signal represents the entire scattered signal in the solid angle $2\pi$ that escaped the detector due to LER, and the factor N comes from coherence. Additionally, the disclosed embodiments measure the total surface roughness of the test structure, as there is no vertical-horizontal bias as is the case with the CDSEM based methods. Furthermore, they are not disruptive to the equipment configuration and require only minor software modification. Thus it is easy to integrate into the existing OCD technology.

Figure 4:
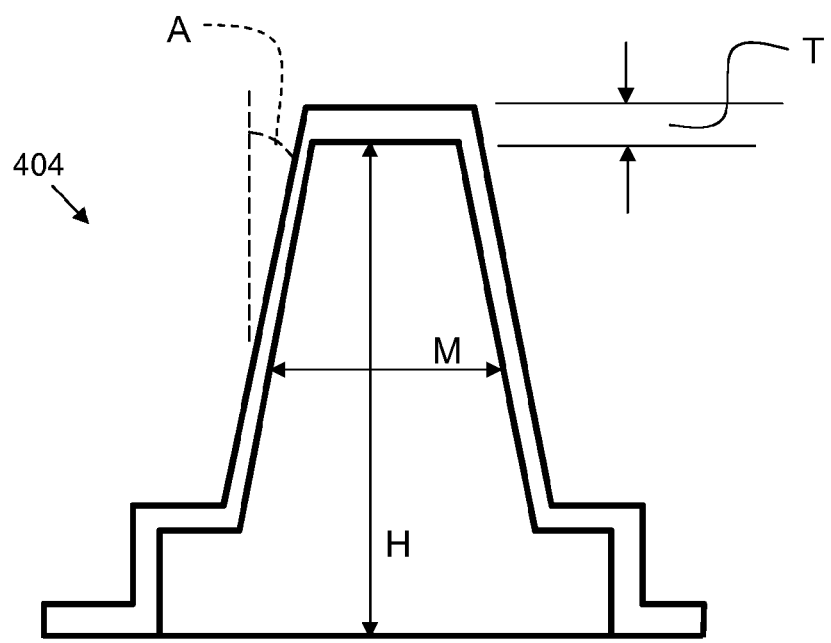

FIG. 4 is a detailed view representing the vertical cut-out 404 of a generic semiconductor test structure, without loss of generality, where M is the median critical dimension, H is the height of the vertical portion, A is the sidewall angle, and T is the artificial liner thickness. RCWA is used to simulate multiple diffraction patterns simulating various wavelengths interacting with sample features of various artificial liner thicknesses T, heights H, median critical dimension M, and sidewall angle A.

In general, a semiconductor simulation test structure in accordance with an embodiment of the present invention may simulate etched materials, deposited resist lines, or a deposited metal or dielectric material. It could also simulate a void or a flat, non-patterned thin film too.

Figure 5:
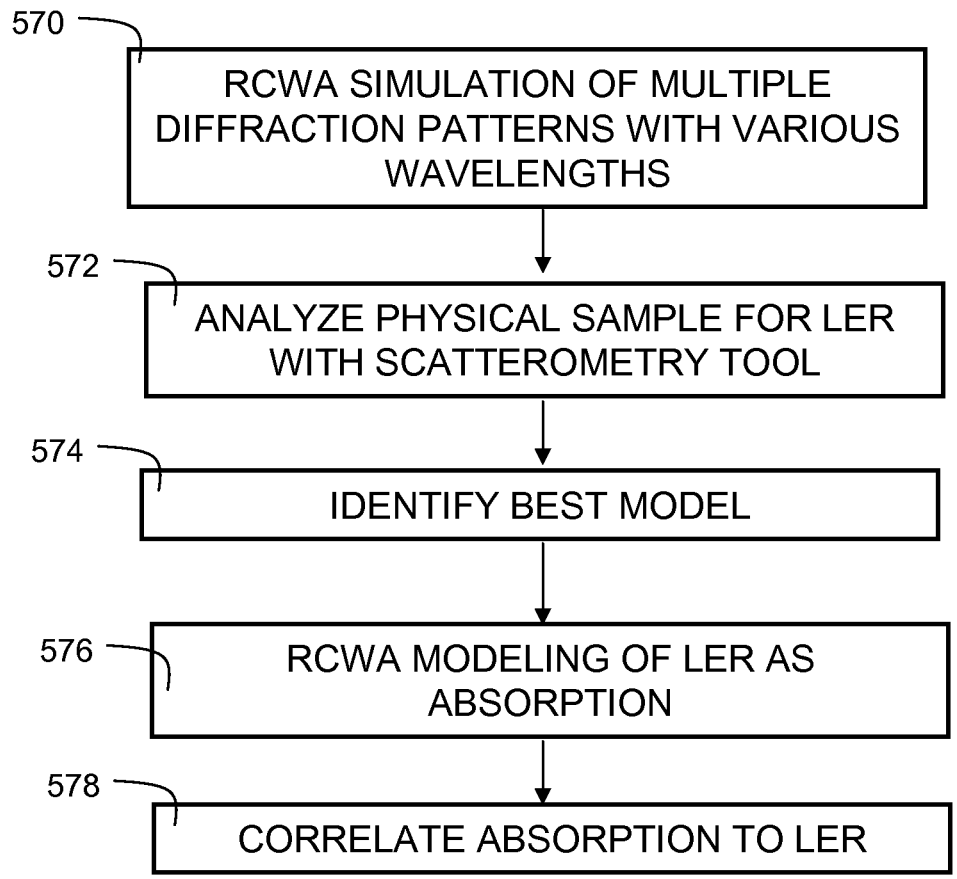

FIG. 5 is a flowchart indicating process steps for an embodiment of the present invention. In process step 570, RCWA is used to simulate multiple diffraction patterns simulating various wavelengths interacting with sample features of various height, median critical dimension, and sidewall angle. The modeled diffraction spectra are stored in a library or database. In process step 572, a physical semiconductor structure with LER is analyzed with a scatterometry tool or equipment (which may use ellipsometry or reflectometry). The output signals of the scatterometry tool are compared with the various samples in the library (generated in step 570 above). Note that the artificial liner 320 (of FIG. 3) only exists in the scatterometry model, and is not a real physical liner that exists in the physical semiconductor structure analyzed by the scatterometry tool. In process step 574, the best matching sample is identified to determine the model best suited for analyzing absorption for this particular case. In process step 576, RCWA is then used to model LER as absorption using the model identified in step 574 above, and the absorption is predicted. In process step 578, the predicted absorption is correlated to a LER level by optimizing $\kappa_{LER}(\lambda)$ and computing $\rho(r)$, Hence, the RCWA algorithm has been used to model the sample-wide random phenomenon of LER.

Figure 6:
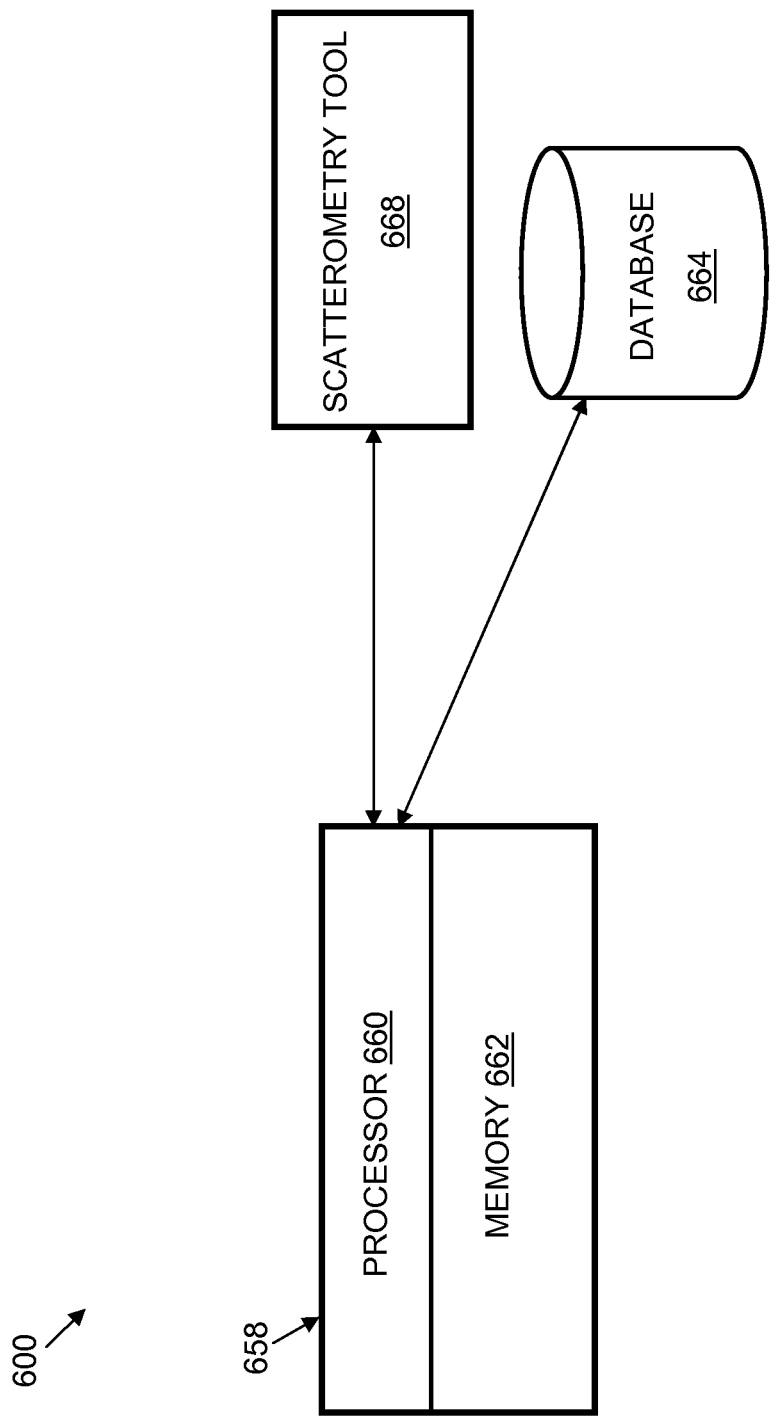

FIG. 6 is a block diagram of a system 600 in accordance with an embodiment of the present invention. System 600 comprises computer 658 which comprises a processor 660 and computer memory 662. Computer memory 662 stores machine instructions, which when executed by processor 660, carry out various methods in accordance with embodiments of the present invention. Computer 658 may have access to database 664, such that information, including RCWA simulation results, may be stored and retrieved from database 664. Computer 658 may also be in communication with scatterometry tool 668. In this way, physical measurements made by scatterometry tool 668 may be quickly compared with simulation results stored in database 664 to identify an optimal model to be used for applying RCWA to model line edge roughness.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of measuring line edge roughness, comprising:
    performing a plurality of rigorous-couples-wave-analysis simulations of absorption with multiple diffraction patterns;
    analyzing a physical semiconductor structure for line edge roughness with a scatterometry tool;
    identifying one of the plurality of rigorous-couples-wave-analysis simulations as a best-fit model based on a minimum residual between signals that are diffracted from the physical semiconductor structure and received from a detector in the scatterometry tool, and simulation data of absorption from the plurality of rigorous-couples-wave-analysis simulations of absorption with multiple diffraction patterns;
    using the best-fit model to derive an optimal extinction parameter value for a semiconductor structure; and
    associating the best-fit model to line edge roughness to identify the model that most closely models the absorption of the physical semiconductor structure; and
    wherein deriving an optimal extinction parameter value comprises:
        determining a real component of the optimal extinction parameter value based on natural absorption in an ideal sample that does not include line edge roughness; and
        determining a line edge roughness component of the optimal extinction parameter value, and wherein the best-fit model is used to manufacture a semiconductor integrated circuit.

2. The method of claim 1, wherein analyzing a physical semiconductor structure for line edge roughness with a scatterometry tool further comprises measuring light reflected from the physical semiconductor structure with a bright-field detector.

3. The method of claim 2, further comprising applying spectroscopic light to the physical semiconductor structure.

4. The method of claim 1, wherein analyzing a physical semiconductor structure for line edge roughness with a scatterometry tool further comprises analyzing the physical semiconductor structure with an ellipsometery-based scatterometry tool.

5. The method of claim 1, wherein analyzing a physical semiconductor structure for line edge roughness with a scatterometry tool further comprises analyzing the physical semiconductor structure with a reflectrometry-based scatterometry tool.

6. The method of claim 1, wherein analyzing a physical semiconductor structure for line edge roughness with a scatterometry tool further comprises applying light having a wavelength ranging from about 200 nanometers to about 900 nanometers to the physical semiconductor structure.

7. The method of claim 1, wherein performing a plurality of rigorous-couples-wave-analysis simulations of absorption with multiple diffraction patterns further comprises modeling diffraction spectra and storing the modeled diffraction spectra in a database.

8. The method of claim 1, wherein determining a line edge roughness component of the total extinction parameter value comprises subtracting the real component of the optimal extinction parameter value from the optimal extinction parameter value.

9. The method of claim 8, wherein the total extinction parameter value is a function of light wavelength, and further comprising selecting an optimized light wavelength.

10. The method of claim 9, wherein selecting an optimized light wavelength comprises minimizing residuals between a signal from a physically measured scatterometry sample and a simulated sample using a chi-square global minimization method.

11. The method of claim 1 further comprising, computing a power spectrum density function for a particular scatterer grain size.

12. The method of claim 1, wherein performing a plurality of rigorous-couples-wave-analysis simulations of absorption with multiple diffraction patterns further comprises:
    computing a Rayleigh scattering function for a particular wavelength and line edge roughness grain size; and
    computing a power spectrum density function for the line edge roughness grain size.

13. A method for measuring line edge roughness, comprising:
    performing a rigorous-couples-wave-analysis simulation of absorption on a semiconductor simulation test structure, wherein the semiconductor simulation test structure comprises a conformal liner, and generating a plurality of modeled diffraction spectra;
    storing the modeled diffraction spectra in the database;
    analyzing a physical semiconductor structure for line edge roughness with the scatterometry tool;
    identifying one of the plurality of rigorous-couples-wave-analysis simulations as a best-fit model based on a minimum residual between signals that are diffracted from the physical semiconductor structure and received from a detector in the scatterometry tool, and simulation data of absorption from the plurality of rigorous-couples-wave-analysis simulations of absorption with multiple diffraction patterns;
    using the best-fit model to derive an optimal extinction parameter value for a semiconductor structure; and
    associating the best-fit model to line edge roughness to identify the model that most closely models the absorption of the physical semiconductor structure; and further comprising:
    determining a real component of the optimal extinction parameter value based on natural absorption in an ideal sample that does not include line edge roughness; and
    determining a line edge roughness component of the optimal extinction parameter value, and wherein the best-fit model is used to manufacture a semiconductor integrated circuit.

14. The method of claim 13, further comprising:
    computing a Rayleigh scattering function for a particular wavelength and line edge roughness grain size; and computing a power spectrum density function for the line edge roughness grain size.

15. A system for measuring line edge roughness, comprising:
- a computer comprising a processor and memory;
- a database configured and disposed to be accessible by the processor;
- a scatterometry tool configured and disposed to communicate with the computer; wherein the memory contains machine instructions, that when executed by the processor, perform the steps of:
- performing a rigorous-couples-wave-analysis simulation of absorption on a semiconductor simulation test structure, wherein the semiconductor simulation test structure comprises data stored in the memory, and wherein the semiconductor simulation test structure comprises a representation of a substrate with an absorptive liner disposed on the substrate, wherein the absorptive liner has a refractive index identical to the substrate refractive index;
- storing the modeled diffraction spectra in the database;
- analyzing a physical semiconductor structure for line edge roughness with the scatterometry tool;
- identifying one of the plurality of rigorous-couples-wave-analysis simulations as a best-fit model based on a minimum residual between signals that are diffracted from the physical semiconductor structure and received from a detector in the scatterometry tool, and simulation data of absorption from the plurality of rigorous-couples-wave-analysis simulations of absorption with multiple diffraction patterns;
- using the best-fit model to derive an optimal extinction parameter value for a semiconductor structure, wherein deriving an optimal extinction parameter value comprises:
- determining a real component of the optimal extinction parameter value based on natural absorption in an ideal sample that does not include line edge roughness; and
- associating the modeled absorption to line edge roughness, wherein the memory further contains data representative of a semiconductor simulation test structure wherein the absorptive liner has a thickness ranging from 1 nanometer to 10 nanometers, and wherein the best-fit model is used to manufacture a semiconductor integrated circuit.

16. The system of claim 15, wherein the memory further contains data representative of a semiconductor simulation test structure wherein the absorptive liner has a refractive index equal to the refractive index of the substrate.

17. The system of claim 15, wherein the memory further contains data representative of a semiconductor simulation test structure wherein the absorptive liner has a density ratio of liner material to ambient gas of 50 percent.

* * * * *